United States Patent
Shah et al.

(10) Patent No.: US 7,755,054 B1
(45) Date of Patent: Jul. 13, 2010

(54) LUTETIUM GADOLINIUM HALIDE SCINTILLATORS

(75) Inventors: Kanai S. Shah, Newton, MA (US); William M Higgins, Westborough, MA (US); Edgar V Van Loef, Allston, MA (US); Jaroslaw Glodo, Allston, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 12/334,351

(22) Filed: Dec. 12, 2008

Related U.S. Application Data

(60) Provisional application No. 61/014,380, filed on Dec. 17, 2007.

(51) Int. Cl.
*G01T 1/20* (2006.01)
(52) U.S. Cl. .................................. 250/361 R
(58) Field of Classification Search .............. 250/361 R
See application file for complete search history.

(56) References Cited

U.S. PATENT DOCUMENTS 5,179,284 A * 1/1993 Kingsley et al. ....... 250/370.11
6,180,946 B1 * 1/2001 Ebstein .................. 250/370.11
7,541,589 B2 * 6/2009 Srivastava et al. ........ 250/361 R

FOREIGN PATENT DOCUMENTS

WO    WO 2008096889 A1 *  8/2008

OTHER PUBLICATIONS

J. Glodo, W. M. Higgins, E. V. D. van Loef, and K. S. Shah, "GdI3:Ce—A New Gamma and Neutron Scintillator" IEEE 2006 Nuclear Science Symposium Conference Record, Nov. 1, 2006, vol. 3, pp. 1574-1577. <doi:10.1109/NSSMIC.2006.354199>.*
K. S. Shah, J. Glodo, M. Klugerman, W. Higgins, T. Gupta, P. Wong, W. W. Moses, S. E. Derenzo, M. J. Weber, and P. Derenbos, "LuI3:Ce—A New Scintillator for Gamma Ray Spectroscopy" IEEE 2003 Nuclear Science Symposium Conference Record, Oct. 25, 2003, vol. 2, pp. 891-894.*
Kyba et al, "Energy and Timing Response of Six Prototype Scintillators for TOF-PET," *IEEE Trans. Nucl. Sci.* 55:1404-1408 (2008).
Gloda et al., "Mixed Lutetium Iodide Compounds," *IEEE 9th Int'l Conf. on Inorganic Scintillators and Their Application*; Windston-Salem, NC USA, Jun. 4-8, 2008 (Abstract only).
Glodo et al., "Mixed Lutetium Iodide Compounds," *IEEE Transactions on Nuclear Science* 55:1496-1500 (2008).

* cited by examiner

*Primary Examiner*—Constantine Hannaher
(74) *Attorney, Agent, or Firm*—Towsend and Townsend and Crew LLP

(57) ABSTRACT

Lutetium gadolinium halide scintillators, devices and methods, including a composition having the formula $Lu_xGd_{(1-x)}$ Halide and a dopant.

25 Claims, 9 Drawing Sheets

LUTETIUM GADOLINIUM HALIDE SCINTILLATORS

CROSS REFERENCES TO RELATED APPLICATIONS

The present application claims the benefit of priority under 35 U.S.C. §119(e) of U.S. Application No. 61/014,380, filed Dec. 17, 2007, the entire content of which is incorporated herein by reference.

STATEMENT REGARDING FEDERALLY SPONSORED RESEARCH OR DEVELOPMENT

This invention was made with government support under grant number DE-FG02-06ER84504 awarded by the Department of Energy. The government may have certain rights in this invention.

BACKGROUND OF THE INVENTION

The present invention relates to scintillator compositions and related devices and methods. More specifically, the present invention relates to scintillator compositions including a scintillation compound and a dopant for use, for example, in radiation detection, including gamma-ray spectroscopy, and X-ray emission and neutron detection.

Scintillation spectrometers are widely used in detection and spectroscopy of energetic photons (e.g., X-rays and gamma-rays). Such detectors are commonly used, for example, in nuclear and particle physics research, medical imaging, diffraction, non destructive testing, nuclear treaty verification and safeguards, nuclear non-proliferation monitoring, and geological exploration.

Some commonly used scintillator materials include thallium-activated sodium iodide (NaI(Tl)), bismuth germanate (BGO), cerium-doped gadolinium orthosilicate (GSO), and cerium-doped lutetium orthosilicate (LSO). While these known scintillator materials do have some desirable scintillation characteristics which make them suitable for certain applications, each of the materials possesses one or more deficiencies that limit their use in a variety of applications. For example, many currently available scintillation materials have low light output characteristics, poor timing resolution (e.g., slow decay time or rise time), or low X-ray or gamma-ray stopping power. Some available materials also have emission spectra not optimally matched for use with certain commonly available photodetectors or have limited temperature ranges at which scintillation is practical or possible. In some instances, utility of certain available scintillators is limited due, for example, to absorption of oxygen and moisture leading to persistent afterglow and high background rate due to radioactive isotope of component elements.

Some important requirements for the scintillation materials include, for example, high light output, transparency to the light it produces, high stopping efficiency, fast response, good proportionality, low cost, and availability in large volume. For certain applications, sensitivity to neutrons is needed. These requirements on the whole cannot be met by any of the commercially available scintillators. While general classes of chemical compositions may be identified as potentially having some attractive scintillation characteristic(s), specific compositions/formulations having both scintillation characteristics and physical properties necessary for actual use in scintillation spectrometers and various practical applications have proven difficult to predict. Specific scintillation properties are not necessarily predictable from chemical composition alone, and preparing effective scintillators from even candidate materials often proves difficult.

Energy resolution is one important characteristic influencing utility of a particular scintillator composition, with energy resolution being affected by factors such as light output and linearity of response. Larger light output also allows for easier crystal determination in scanners that use discrete crystal arrays. Good energy resolution makes it possible to separate photopeak events from those in which the photon has scattered in the patient, making energy resolution very important for applications such as 3-D whole body positron emission tomography (PET). Better crystal determination leads to improved scanner spatial resolution. The sensitivity of the scanner is determined by the effective Z and density of the crystal. The effective Z of the crystal affects the fraction of photons that Compton scatter in the crystal, rather than depositing all their energy in a photoelectric interaction. Scanners which use low Z crystals have poorer spatial resolution, as photons may produce a Compton electron in one crystal and a photoelectric interaction in another. The stopping power is directly proportional to crystal density, and is also somewhat dependent upon the crystal's effective Z. Finally, the decay time of the scintillator is important for several reasons. First, the faster photons are emitted by the scintillator, the better the scanner timing resolution will be. The position uncertainty along the LOR in an event is proportional to $c\Delta t/2$, and TOF-PET reconstruction algorithms can take advantage of this to improve the signal to noise ratio in the reconstructed image. Second, the longer the scintillator emits light, the longer the dead time between pulses. This is particularly a problem for pixelated detectors which utilize light sharing among multiple PMTs to determine which crystal absorbed the 511 keV photon. Thus, the search for new scintillators that are proportional, have higher light outputs, faster decay times, and higher densities than currently available scintillators is an active field of research.

As a result, there is continued interest in new scintillator compositions and formulations with both the enhanced performance and the physical characteristics needed for use in various applications. Today, the development of new scintillator compositions continues to be as much an art as a science, since the composition of a given material does not necessarily determine its properties as a scintillator, which are strongly influenced by the history (e.g., fabrication process) of the material as it is formed. While it may be possible to reject a potential scintillator for a specific application based solely on composition, it is typically difficult to predict whether even a material with a promising composition can be used to produce a useful scintillator with the desired properties.

Thus, a need exists for improved scintillator compositions suitable for use in radiation detection applications.

BRIEF SUMMARY OF THE INVENTION

The present invention provides a scintillator composition including a lutetium gadolinium halide compound and a dopant, and related devices and methods. Scintillator compositions can include, for example, scintillation compounds having the formula $Lu_xGd_{(1-x)}$ Halide (e.g., $Lu_xGd_{(1-x)}I_3$) properties of which are disclosed herein. Excellent scintillation properties, including high light output, good proportionality, fast response, and good energy resolution have been measured for these compositions, which demonstrated to be very promising for gamma-ray spectroscopy, as well as X-ray and neutron emission detection. These new scintillators include materials that are trigonal and have high light output and fast response. These materials have good proportionality (e.g., measured in one embodiment at about 7.5% non-proportionality over 60 to 662 keV energy range). These materials additionally advantageously combine excellent gamma-ray detection properties along with neutron detection.

One aspect of the present invention includes a scintillator composition including a lutetium gadolinium halide compound and a dopant. Scintillators can include, e.g., compounds having the formula $Lu_xGd_{(1-x)}I_3$, which may be represented herein by, for example, $LuGdI_3$, $GdLuI_3$, or $LuGdI_3$:Ce. The scintillator compositions can include a single dopant or a mixture of dopants. In certain embodiments, the dopant can include cerium. Starting materials for the scintillator compositions can include Gadolinium Halide and Lutetium Halide compositions including, for example, Lutetium Iodide ($LuI_3$) or Lutetium Bromide ($LuBr_3$), or Gadolinium Iodide ($GdI_3$) or Gadolinium Bromide ($GdBr_3$). In certain embodiments, the scintillator compositions can have gamma-ray stopping efficiencies comparable or, in some embodiments, significantly higher than common scintillation detection compositions, such as NaI:Tl, CsI:Tl, and $BaF_2$. Furthermore, scintillator compositions as described herein having Gd provide sensitivity to neutrons. The scintillator compositions of the present invention are particularly useful, for example, for spectroscopy detection of energetic photons (e.g., X-rays, neutrons and gamma-rays).

Notable characteristics for the scintillation compositions of the invention include surprisingly robust light output, high stopping efficiency (attenuation) for energetic photons, high sensitivity to neutrons, and fast response. In one embodiment, the scintillator compositions of the present invention include a combination of high light output and fast timing (e.g., fast decay time, timing resolution, etc.) that is very high among commercially available scintillator compositions. Furthermore, the scintillator compositions can be efficiently and economically produced. Detectors having a LuGd Halide (e.g., $Lu_xGd_{(1-x)}I_3$) scintillator composition are useful in a wide variety of applications, including without limitation nuclear and high energy physics research, medical imaging, diffraction, non-destructive testing, nuclear treaty verification and safeguards, and geological exploration.

Scintillation properties of the above crystals can include a peak emission wavelength in one example at approximately 530 nm, which is reasonably matched to PMTs and very well matched to silicon diodes used in nuclear instrumentation. Scintillator compositions of the present invention include fast timing scintillators with a rapid rise time and a fast decay time constant. Rise time of the scintillator compositions will typically be less than about 1.0 nanosecond (ns) and more typically about 0.5 ns or less, and time resolution will typically be less than about 1.5 nanosecond (ns) and more typically about 0.25 ns or less. Decay time constant, in certain embodiments, can be less than about 100 ns, or less than about 50 ns, and more typically less than about 30 ns. In one embodiment, the principal decay-time constant was measured at approximately 34 ns, which is faster than the decay-time constant of commercial scintillators such as BGO, LSO, NaI:Tl, and GSO (see, e.g., Table 1 infra). Under gamma ray excitation, the light output can be greater than 40,000 photons/MeV and, in some embodiments, greater than 80,000 photons/MeV, which is comparable to and/or greater than that of many commercial scintillators. The light output of $LuGdI_3$:2% Ce, in one embodiment, was measured at about 82,600 photons/MeV.

The measured initial photon intensity in the described scintillator compositions, which is a figure of merit for timing applications, is also higher compared to other available commercial scintillator compositions. Initial photon intensity will typically be greater than about 1,000 photons/(ns×MeV) or greater than about 1,500 photons/(ns×MeV). In one embodiment, the initial photon intensity was 1,640 photons/(ns×MeV). The combination of high light output and fast response compared to existing scintillators indicates surprisingly high energy and timing resolution with LuGd Halide (e.g., $Lu_xGd_{(1-x)}I_3$) scintillators of the present invention. These properties are very attractive in radiation monitoring and detection applications, in general, and in imaging applications, such as positron emission tomography (PET) imaging, in particular. Thus, the scintillators of the invention provide the opportunity for use in applications requiring a fast scintillator, such as time-of-flight (TOF) PET imaging, which thereby, e.g., would provide additional gain in signal to noise ratio and image quality. Due to high atomic number constituents and high densities, LuGd Halide (e.g., $Lu_xGd_{(1-x)}I_3$) scintillator compositions of the present invention provide high gamma-ray sensitivity. Attenuation length will typically be less than about 2.0 cm (511 keV). Thus, competitive gamma-ray detection properties are combined in $LuGdI_3$ with high neutron sensitivity.

Another aspect of the present invention further includes devices having the scintillator compositions described here. Such a device can include a radiation detection device having a scintillator composition including a lutetium gadolinium halide compound of the invention and a dopant; and a photodetection assembly optically coupled to the scintillator composition. The photodetection assembly can include, for example, a photomultiplier tube, a photo diode, or a PIN detector. The device may further include a data analysis system or computer system for outputting, processing, and/or analyzing detected signals.

In yet another aspect, the invention includes an X-ray and neutron detector assembly, including a scintillator composition including a lutetium gadolinium halide compound and a dopant, a photodetection assembly, and electronics or a computer system for data processing/analysis. For example, the device can include electronics configured for performing pulse-shape analysis to differentiate gamma ray from neutron emissions.

In yet another aspect, the invention includes a method of performing radiation detection. Such a method can include, for example, providing a detection device having a detector assembly including scintillator composition including a lutetium gadolinium halide compound and a dopant; a photodetection assembly; and positioning a target within a field of view of the scintillator as to detect emissions from the target. Emissions can include, for example, gamma-ray, X-ray, or neutron emissions. A target can include various potential sources of detectable emissions including neutron emitters (e.g., plutonium and the like), gamma-ray sources (e.g., uranium and the like), X-ray sources, etc. In one embodiment, for example, the scintillator compositions can be used for imaging applications including medical imaging such as in a method of performing PET (e.g., time-of-flight PET) or SPECT. In such an embodiment, the imaging method can include injecting or otherwise administering a patient with a detectable label, and, after a sufficient period of time to allow localization or distribution of the label, placing the patient within the field of view of the detection device. Thus, in some embodiments the target includes a patient or a portion of a patient's body.

For a fuller understanding of the nature and advantages of the present invention, reference should be had to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

DETAILED DESCRIPTION OF THE INVENTION

Figure 1:
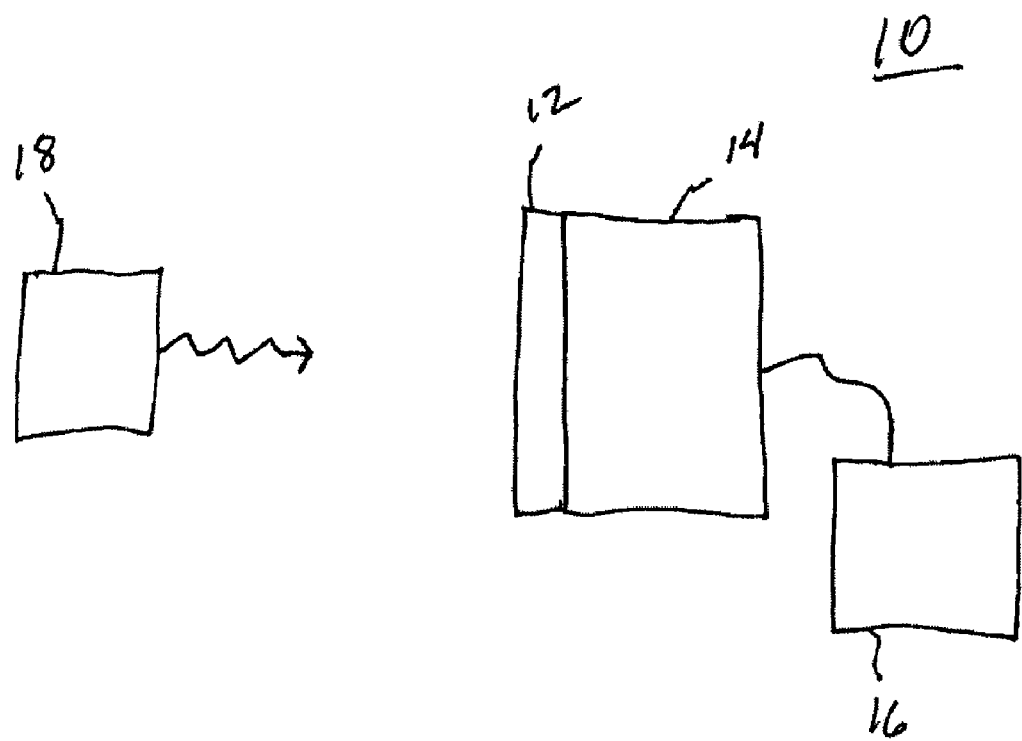
FIG. 1 is a conceptual diagram of a detector assembly according to an embodiment of the present invention.

This invention will be better understood with resort to the following definitions:

A. Rise time, in reference to a scintillation crystal material, shall mean the speed with which its light output grows once a gamma-ray has been stopped in the crystal. The contribution of this characteristic of a scintillator combined with the decay time contributes to a timing resolution. A timing resolution of less than 500 picoseconds (ps) is of particular interest for use in methods including time-of-flight detection of an annihilation event as originating within about a 30 cm distance.

B. A Fast timing scintillator (or fast scintillator) typically requires a timing resolution of about 500 ps or less. For certain PET applications (e.g., time-of-flight (TOF)) the fast scintillator should be capable of localizing an annihilation event as originating from within about a 30 cm distance, i.e., from within a human being scanned.

C. Timing accuracy or resolution, usually defined by the full width half maximum (FWHM) of the time of arrival differences from a point source of annihilation gamma-rays. Because of a number of factors, there is a spread of measured values of times of arrival, even when they are all equal. Usually they distribute along a bell-shaped or Gaussian curve. The FWHM is the width of the curve at a height that is half of the value of the curve at its peak.

D. Light Output shall mean the number of light photons produced per unit energy deposited by the detected gamma-ray, typically the number of light photons/MeV.

E. Stopping power or attenuation shall mean the range of the incoming X-ray or gamma-ray in the scintillation crystal material. The attenuation length, in this case, is the length of crystal material needed to reduce the incoming beam flux to $1/e^-$.

F. Proportionality of response (or linearity). For some applications (such as CT scanning) it is desirable that the light output be substantially proportional to the deposited energy.

G. Coincidence timing window/coincidence detection shall mean the length of time allowed for deciding whether two distinct gamma-rays have been detected. In PET, this window is desired to be as short as possible, but no shorter than the time it takes the gamma-rays to travel through the body (>1 ns).

H. Single line time-of-flight (TOF) localization shall mean the process by which, through timing of the signals, the position of the annihilation event is localized to a portion of the line joining the detectors, this portion being smaller than the length of the line.

I. Position sensitive detector or array shall mean a detector where the position of the energy signal (e.g., gamma-ray, X-ray, neutron, etc.) interaction within the detector is determined. In some embodiments this is done through the Anger principle of light division. For instance, there can be a photodetector at each end of the scintillator composition and the proportion of light reaching each detector determines position, or an array of photodetectors where the center of mass of the light distribution determines position (i.e., the closest detectors get more light).

The present invention can optionally include correcting for different timing offsets of an individual detector. Such correcting shall be understood to include, among others, software code that stores each detector's individual timing delay and code to subtract from each timing signal this pre-stored value. A method to introduce through delay lines (cables through which the signal travels) a fixed delay for each detector, so that their signals all have the same arrival delay at the timing electronics.

The present invention relates to lutetium gadolinium halide scintillator compositions, which may include a ratio of Lutetium (Lu) and Gadolinium (Gd). In the scintillator material of the invention, $Lu^{3+}$ and $Gd^{3+}$ each serve as an intrinsic constituent. In particular embodiments, the scintillator compositions may include the halide, e.g., iodide. Starting materials for the scintillator compositions may include, for example, Lutetium Iodide ($LuI_3$) or Lutetium Bromide ($LuBr_3$), or Gadolinium Iodide ($GdI_3$) or Gadolinium Bromide ($GdBr_3$). In certain embodiments, a dopant or mixture of dopants can be included in the scintillator compositions. For example, the dopant $Ce^{3+}$ is a luminescence center, the emission wavelength of 530 nm being consistent with the 5d →4f transition of $Ce^{3+}$.

The scintillation compositions of the present invention will respond by emitting light after detecting charged particles, high energy photons, and neutrons, thereby providing useful scintillation properties. Scintillator compositions of the present invention include a lutetium gadolinium halide scintillator compound and one or more dopants. A scintillation compound can include, for example, a compound having the formula $Lu_xGd_{(1-x)}$ Halide, e.g., $Lu_xGd_{(1-x)}I_3$.

Lutetium and gadolinium may be present at various concentrations and ratios in the LuGd Halide (e.g., $Lu_xGd_{(1-x)}I_3$) scintillator compositions of the present invention. Certain properties of the scintillator composition may be selected based on the relative concentrations and ratios of lutetium and gadolinium in the scintillator materials. For example, relative concentrations can be selected for desired stopping power characteristics. Stopping power of energetic photons (e.g., X-ray stopping power) typically increases with increased concentrations of composition constituents having a high atomic number. Lutetium has an atomic number of 71, whereas gadolinium has an atomic number of 64. In certain embodiments of the scintillation compositions of the present invention, X-ray stopping power can be increased, for example, by increasing the relative concentration of lutetium with respect to gadolinium. Lutetium can be present at a molar ratio, with respect to gadolinium, of less than about 1(Lu):0(Gd) (e.g., wherein x is less than about 1) to more than 0.1(Lu):0.9(Gd) (e.g., wherein x greater than about 0). In a particular embodiment, lutetium is present at a molar ratio, with respect to gadolinium, of about 0.5(Lu):0.5(Gd).

Since lutetium halides and gadolinium halides melt congruently, lutetium gadolinium halide scintillator compositions can be grown using crystal growth techniques such as Bridgman and Czochralski, which are generally easy to scale up. The melting points of $LuI_3$ and $GdI_3$ are 1050° C. and 925° C., respectively, both of which are substantially lower than the melting point of LSO and GSO (>2000° C.). As a result, the eventual cost of $Lu_xGd_{(1-x)}I_3$ scintillator compositions, for example, can be expected to be lower than that of other commercial scintillators, such as LSO and GSO. This issue is particularly relevant in modern instrumentation (e.g., PET instrumentation) where the high cost of the detector components can be a limitation to commercial application.

The scintillator compositions of the invention are particularly useful, for example, for spectroscopy detection of energetic photons (e.g., X-rays, gamma-rays), as well as for neutron emission detection. Notable characteristics for the scintillation compositions of the invention include surprisingly robust light output, high gamma-ray and neutron stopping efficiency (attenuation), fast response, and good non-proportionality. Furthermore, the scintillator compositions can be efficiently and economically produced. Thus, detectors having scintillator compositions described in the present invention are useful in a wide variety of applications, including without limitation nuclear and high energy physics research, medical imaging, diffraction, non-destructive testing, nuclear treaty verification and safeguards, and geological exploration.

As noted above, a scintillator composition of the present invention can optionally include a "dopant." Dopants can affect certain properties, such as physical properties (e.g., brittleness, etc.) as well as scintillation properties (e.g., luminescence, etc.) of the scintillator composition. The dopant can include, for example, cerium (Ce), praseodymium (Pr), lutetium (Lu), lanthanum (La), europium (Eu), samarium (Sm), strontium (Sr), thallium (Tl), chlorine (Cl), fluorine (F), iodine (I), and mixtures of any of the dopants. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.1% to about 20%, by molar weight. In certain embodiments, the amount of dopant is in the range of about 0.1% to about 100%, or about 0.1% to about 5.0%, or about 5.0% to about 20%, or about 1.0% to about 20%, by molar weight.

The scintillator compositions of the invention may be provided in several different physical forms. In some embodiments, the composition is in a crystalline form (e.g., monocrystalline). Scintillation crystals, such as monocrystalline scintillators, have a greater tendency for transparency than other forms. Scintillators in crystalline form (e.g., scintillation crystals) are often useful for high-energy radiation detectors, e.g., those used for gamma-ray or X-ray detection. However, the composition can include other forms as well, and the selected form may depend, in part, on the intended end use of the scintillator. For example, a scintillator can be in a powder form. It can also be prepared in the form of a ceramic or polycrystalline ceramic. Other forms of scintillation compositions will be recognized and can include, for example, glasses, deposits, vapor deposited films, and the like. It should also be understood that a scintillator composition might contain small amounts of impurities. Also, minor amounts of other materials may be purposefully included in the scintillator compositions to affect the properties of the scintillator compositions.

Methods for making crystal materials can include those methods described herein and may further include other techniques. Typically, the appropriate reactants are melted at a temperature sufficient to form a congruent, molten composition. The melting temperature will depend on the identity of the reactants themselves (see, e.g., melting points of reactants), but is usually in the range of about 300° C. to about 1350° C. Non-limiting examples of the crystal-growing methods can include certain techniques of the Bridgman-Stockbarger methods; the Czochralski methods, the zone-melting methods (e.g., single zone, "floating zone" method), the vertical gradient freeze (VGF) methods, the temperature gradient methods, and modifications thereof. See, e.g., Example 1 infra. (see also, e.g., "Luminescent Materials", by G. Blasse et al, Springer-Verlag (1994) and "Crystal Growth Processes", by J. C. Brice, Blackie & Son Ltd (1986)).

In the practice of the present invention, attention is paid to the physical properties of the scintillator material. In particular applications, properties such as hygroscopy (tendency to absorb water), brittleness (tendency to crack), and crumbliness should be minimal.

TABLE I

Properties of Scintillators

| Host | Emission nm | Light Output ph/MeV | Decay Time ns |
|---|---|---|---|
| $LuI_3$ | 505 | 110,500 | 28 |
| $LuI_3$ - $YI_3$ | 510 | 72,200 | 28 |
| $LuI_3$ - $GdI_3$ | 530 | 82,600 | 29 |
| $YI_3$ | 532 | 99,500 | 34 |
| $GdI_3$ | 552 | 98,700 | 33 |
| BGO | 480 | 8,200 | 300 |

Table I provides a listing of certain properties of a number of scintillators, including properties of a LuGd Halide composition of the present invention as measured in one embodiment. Compared to other commercially available scintillators, including those listed in Table I as well as CsI(Tl) and NaI(Tl) (not shown), which are the most commonly used and among the scintillation materials with the highest known light output, $LuGdI_3$:2% Ce, for example, produces nearly twice the light output. While the scintillator compositions of the present invention produce greater or comparable light output compared to established commercially available scintillators such as CsI(Tl) and NaI(Tl), the present scintillator compositions offer faster timing (e.g., decay constant), light output, than many available scintillators. For example, $LuGdI_3$:2% Ce has a fast principal decay constant (e.g., about 34 ns) and high initial photon density.

As set forth above, scintillator compositions of the present invention may find use in a wide variety of applications. In one embodiment, for example, the invention is directed to a method for detecting energy radiation (e.g., gamma-rays, X-rays, neutrons, etc.) with a scintillation detector including the scintillator compositions of the invention.

FIG. 1 is a diagram of a detector assembly of the present invention. The detector 10 includes a scintillator 12 optically coupled to a light photodetector 14 or imaging device. The detector assembly 10 can include a data analysis system 16 to process information from the scintillator 12 and light photodetector 14. In use, the detector 10 detects energetic radiation emitted from a source 18.

A data analysis, or computer, system thereof can include, for example, a module or system to process information (e.g., radiation detection information) from the detector/photodetectors can also be included in an invention assembly and can include, for example, a wide variety of proprietary or commercially available computers, electronics, or systems having one or more processing structures, a personal computer, mainframe, or the like, with such systems often having data processing hardware and/or software configured to implement any one (or combination of) the method steps described herein. Any software will typically include machine readable code of programming instructions embodied in a tangible media such as a memory, a digital or optical recording media, optical, electrical, or wireless telemetry signal recording media, or the like, and one or more of these structures may also be used to transmit data and information between components of the system in any of a wide variety of distributed or centralized signal processing architectures.

The detector assembly typically includes material formed from the scintillator composition described herein (e.g., one or more scintillator crystals). The detector further can include, for example, a light detection assembly including one or more photodetectors. Non-limiting examples of photodetectors include photomultiplier tubes (PMT), photodiodes, CCD sensors, image intensifiers, and the like. Choice of a particular photodetector will depend in part on the type of radiation detector being fabricated and on its intended use of the device. In certain embodiments, the photodetector may be position-sensitive.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Various technologies for operably coupling or integrating a radiation detector assembly containing a scintillator to a detection device can be utilized in the present invention, including various known techniques.

The detectors may also be connected to a visualization interface, imaging equipment, or digital imaging equipment (e.g., pixilated flat panel devices). In some embodiments, the scintillator may serve as a component of a screen scintillator. For example, powdered scintillator material could be formed into a relatively flat plate, which is attached to a film, such as photographic film. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like.

Imaging devices, including medical imaging equipment, such as the PET and SPECT devices, and the like, represent another important application for invention scintillator compositions and radiation detectors. In PET applications, a radiopharmaceutical or detectable label is administered to a patient and may become concentrated within a specific tissue or organ. Radionuclides from the compound decay and emit positrons. When the positrons encounter electrons, they are annihilated and converted into photons, or gamma-rays. The PET scanner can locate these "annihilations" and thereby reconstruct an image of the tissue/organ for observation. The detector modules in the scanner usually include a number of "cameras" or "detectors," along with the associated circuitry, for detecting annihilation events and reconstructing an image of the patient's tissue or organ. For non-limiting examples of techniques for operably coupling detectors containing a scintillator to a detection device see, e.g., U.S. Pat. No. 6,989,541 (titled "Coincident neutron detector for providing energy and directional information") and commonly owned U.S. Pat. No. 7,173,247, the latter of which is herein incorporated by reference in its entirety.

In some embodiments, where the scintillators are fast scintillators, the compositions of the present invention may be particularly useful in certain medical imaging applications, such as PET applications, including time-of-flight (TOF) PET. However, these detectors are not limited to PET cameras. They are also useful, for example, in other applications where fast decay of the light signal is desirable. One such application is X-ray computed tomography (CT), where, as rotation times and individual detector size decreases, detector response time becomes more important. The high linearity of output of the scintillators of the present invention is of particular use in this type of application.

In some embodiments, where the invention scintillator compositions are fast scintillators, the compositions may be used, for example, in conjunction with methods to calibrate each detector to correct for differential time lags that confuse relative timing measurements. In particular embodiments, such corrections are performed by introducing hardwired delays of appropriate lengths or by software processing based on pre-stored delay times for each detector. Within the practice of the present invention, scintillators are used in individual detectors (detector modules) or read by position-sensitive photodetectors or arrays of photodetectors that detect the light from the scintillation of the crystal or ceramic. For non-limiting examples of other fast scintillators and use of scintillator compositions in medical imaging applications, including PET (e.g., TOF), see, for example, commonly owned U.S. Application Publication No. 2005-0104001, which is incorporated herein by reference.

Furthermore, geological exploration devices, such as well-logging devices, were mentioned previously and represent an important application for these radiation detectors. The assembly containing the scintillator usually includes, for example, an optical window at one end of the enclosure-casing. The window permits radiation-induced scintillation light to pass out of the scintillator assembly for measurement by the photon detection assembly or light-sensing device (e.g., photomultiplier tube, etc.), which is coupled to the scintillator assembly. The light-sensing device converts the light photons emitted from the scintillator into electrical pulses that may be shaped and digitized, for example, by the associated electronics. By this general process, gamma-rays can be detected, which in turn provides an analysis of geological formations, such as rock strata surrounding the drilling bore holes.

In many of the applications of a scintillator composition as set forth above (e.g., nuclear weapons monitoring and detection, imaging, and well-logging and PET technologies), certain characteristics of the scintillator are desirable, including high light output, fast rise time and short decay time, good timing resolution, and suitable physical properties. The present invention is expected to provide scintillator materials that can provide the desired high light output and initial photon intensity characteristics for demanding applications of the technologies. Moreover, the invention scintillator compositions are also expected to simultaneously exhibit the other important properties noted above, e.g., fast rise time, short decay time, good stopping power, and timing resolution. Furthermore, the scintillator materials are also expected to be produced efficiently and economically, and also expected to be employed in a variety of other devices which require radiation/signal detection (e.g., gamma-ray, X-ray, neutron emissions, and the like).

The following examples are intended to illustrate but not limit the invention.

EXAMPLES

Example 1

The present example provides a method for growing and provides characterization for the scintillator composition crystals. The following examples are offered by way of illustration, not by way of limitation.

Crystal Growth of $LuGdI_3$ $LuGdI_3$ has trigonal crystal structure and its density is approximately between 5.2-5.6 g/cc. The scintillator composition melts congruently at about 1000° C., and therefore crystals can be grown using melt based methods such as those described by Bridgman and Czochralski. These melt-based processes are well suited for growth of large volume crystals (Brice, *Crystal Growth Processes*, Blackie Halsted Press (1986)). The Bridgman method has been used for growing $LuGdI_3$ crystals. Both the vertical and horizontal orientations of the Bridgman method can be used in producing crystals of the present invention. In certain embodiments, the vertical Bridgman method was used in producing crystals examined and discussed below.

Prior to actual Bridgman growth, a mixture of $LuI_3$, $GdI_3$ and $CeI_3$ was prepared. $GdI_3$ and $LuI_3$ have the same crystal structures, which allows them to be relatively easily mixed. A concentration of 2% $Ce^{3+}$ was evaluated in one example, although a wide range of additional concentrations can also be utilized (e.g., 0.1%, 1-5%, 5-20%, 10%, 20%, 30%, 40%, 50%, 60%, and up to less than about 100%). Ultra-dry, high purity (e.g., 99.99% purity) $LuI_3$ and $GdI_3$ were used and $Ce^{3+}$ was incorporated in a range of about 2.0% (on a molar weight basis) by adding $CeI_3$ to the mixture. These constituents were mixed and then placed in an ampoule (e.g., quartz, tantalum, or glassy carbon crucibles). The ampoule was evacuated, sealed and then heated in a single zone furnace to a temperature above the melting point of $LuI_3$, $GdI_3$ and $CeI_3$ (e.g., above about 1050° C. and below about 1100° C.), thus allowing the constituents to mix and react in the melt phase to form $Lu_xGd_{(1-x)}I_3$:Ce. Upon cooling, the solid phase of $LuGdI_3$:Ce was available for use as feed material for the Bridgman growth process.

In one embodiment, a two zone Bridgman furnace can be used for $LuGdI_3$:Ce growth. In use, the higher temperature zone ($T_1$) of the furnace was kept above the melting point of the compound, and the lower temperature zone ($T_2$) was maintained below the melting point. Thus, feed material in the furnace first melts while in the zone defined by $T_1$ and then crystallizes out in the zone defined by $T_2$. The speed at which the solid-liquid interface is moved, as determined by the temperature gradient in the furnace, and the shape of the interface are parameters influential in growing high quality crystals. In a second embodiment, a two zone furnace is used, the temperature $T_1$ is set at about 1100° C., while the temperature $T_2$ is about 900° C. The value of $T_2$ keeps the bottom zone temperature below the melting point of one of the major constituents, $GdI_3$=925° C. Growth rate (e.g., the rate of motion of zone $T_1$) affects how close the conditions at the solid-liquid interface come to equilibrium and, at very slow rates, the system operates close to equilibrium. Typical growth rates for the Bridgman process are about 1-10 mm/hour. Growth rates ranging from about 1 mm/day to about 1 cm/hour may be utilized. Additionally, in some instances zone leveling of the ingot may be performed in order to maintain a uniform $Ce^{3+}$ doping level over its entire length.

Scintillation Properties of $LuGdI_3$

Scintillation properties of small Bridgman grown $LuGdI_3$ crystals have been characterized. This investigation involved measurement of the light output, emission spectra, decay time, and time resolution of the crystals.

1. Light Output

Figure 2:
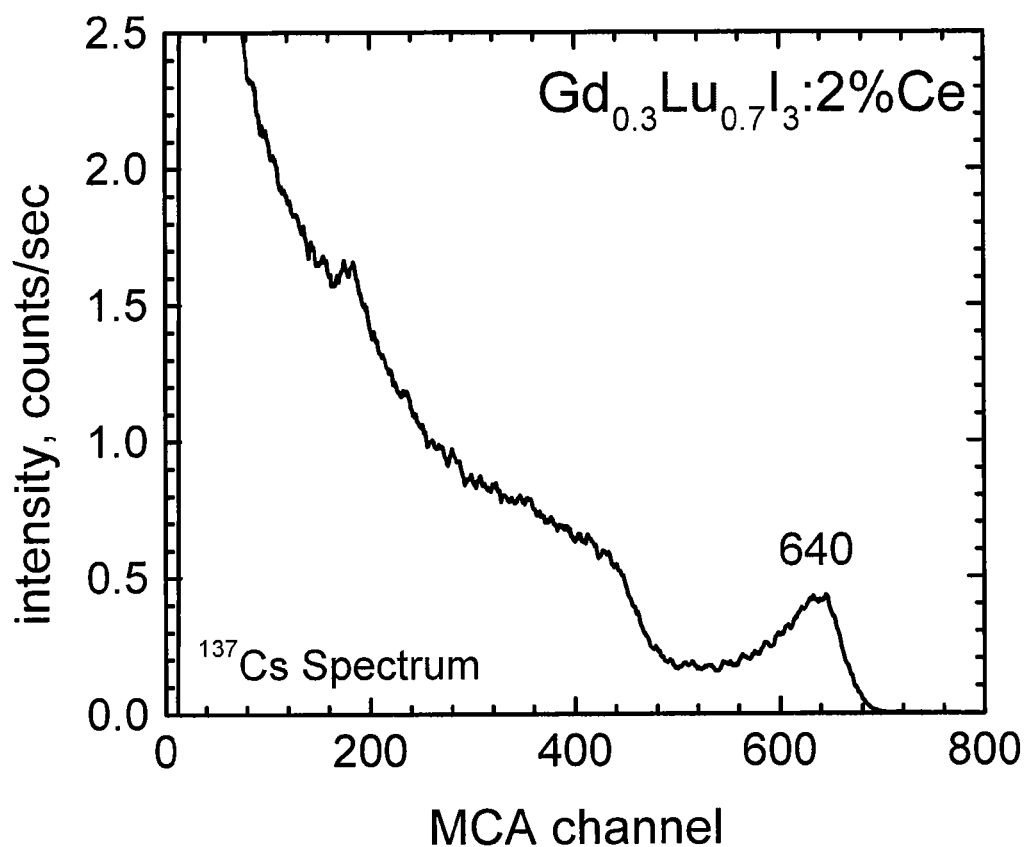
FIG. 2 depicts a $^{137}$Cs spectra collected in one exemplary embodiment with $Gd_{0.3}Lu_{0.7}I_3$:2% Ce coupled to a PMT. The light output of $Gd_{0.3}Lu_{0.7}I_3$:2% Ce has been estimated to be more than 80,000 photons/MeV.

The light output of $LuGdI_3$ crystals was measured by comparing their response to 662 keV γ-rays ($^{137}$Cs source) to the response of a BGO scintillator to the same isotope (BGO spectrum not shown). This measurement involved optical coupling of a $Gd_{0.3}Lu_{0.7}I_3$:2% Ce crystal to a photomultiplier tube (with multi-alkali S-20 photocathode), irradiating the scintillator with 662 keV photons and recording the resulting pulse height spectrum. In order to maximize light collection, the $LuGdI_3$ crystal was covered by reflective, white Teflon tape on all faces (except the one coupled to PMT). An index matching silicone fluid was also used at the PMT-scintillator interface. A pulse height spectrum was recorded with a $LuGdI_3$ crystal. This experiment was then repeated with a BGO scintillator. Comparison of the photopeak position obtained with $Gd_{0.3}Lu_{0.7}I_3$:2% Ce for 662 keV photon energy to that with BGO provided an estimation of light output for the $LuGdI_3$ crystal. BGO demonstrated a peak position at about 110 CH. FIG. 2 shows the pulse height spectrum for $Gd_{0.3}Lu_{0.7}I_3$:2% Ce under $^{137}$Cs irradiation and amplifier shaping time of 4.0 μs. This shaping time is long enough to allow full light collection from both the scintillators. The PMT bias and amplifier gain were the same for both spectra. Based on the recorded photopeak positions for $LuGdI_3$ and BGO, and by taking into account the photocathode quantum efficiency for BGO and $LuGdI_3$, light output of the $Gd_{0.3}Lu_{0.7}I_3$:2% Ce crystal was estimated in one embodiment to be more than 80,000 photons/MeV. The scintillator compositions exhibited light outputs ranging, for example, from greater than about 40,000 photons/MeV, and even greater than about 80,000 photons/MeV.

2. Emission Spectrum

Figure 3:
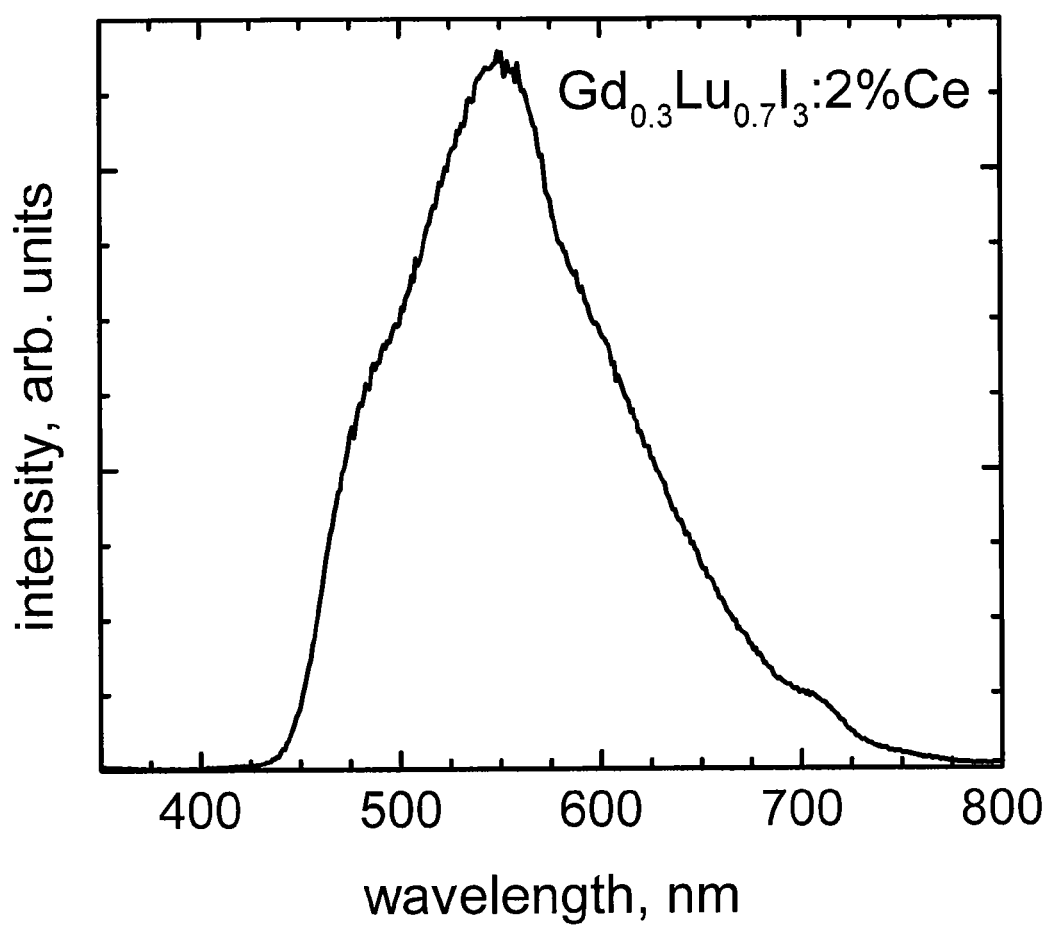
FIG. 3 depicts the optical emission spectrum in one embodiment for a $Gd_{0.3}Lu_{0.7}I_3$:2% Ce scintillator upon exposure to X-rays.

The emission spectrum of a $LuGdI_3$ scintillator has been measured. $LuGdI_3$ sample was excited with radiation from a Philips X-ray tube having a Cu target, with power settings of 40 kVp and 20 mA. The scintillation light was passed through a McPherson monochromator and detected by a Burle C31034 photomultiplier tube. A normalized emission spectrum for a $Gd_{0.3}Lu_{0.7}I_3$:2% Ce sample is shown in FIG. 3. In one embodiment, the peak emission wavelength for the $Gd_{0.3}Lu_{0.7}I_3$:2% Ce sample was at about 550 nm, which is attractive for gamma-ray spectroscopy because it matches reasonably well with the spectral response of photomultiplier tubes as well as very well matched to a new generation of silicon photodiodes.

3. Decay Time

Figure 4:
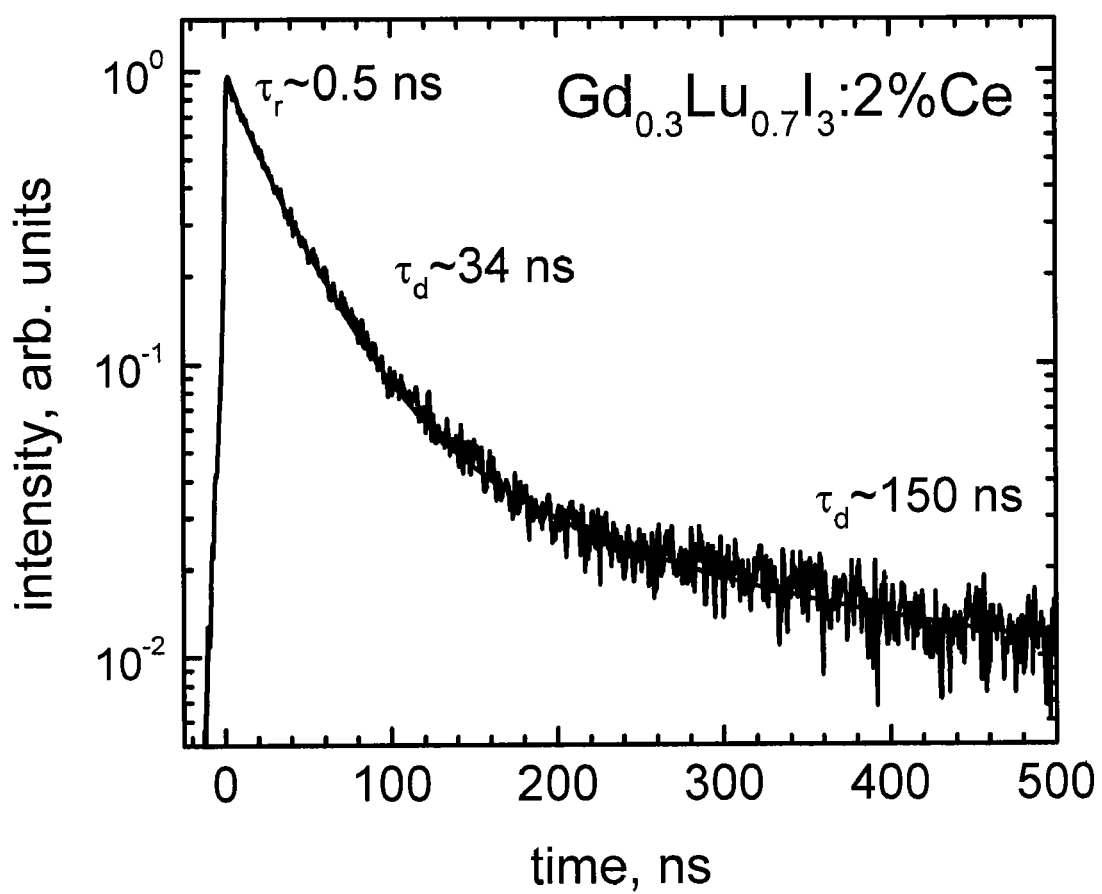
FIG. 4 depicts the decay-time spectrum in one exemplary embodiment, for a $Gd_{0.3}Lu_{0.7}I_3$:2% Ce scintillator, which had a rise time, $\tau_r$, of ~0.5 ns and primary decay time constant, $\tau_d$, of 34 ns.

Decay-time spectrum of a $LuGdI_3$ crystal has been measured using the delayed coincidence method (Bollinger and Thomas, *Rev. Sci. Instr.* 32:1044 (1961)). FIG. 4 shows the decay-time spectrum recorded in one exemplary embodiment for a $Gd_{0.3}Lu_{0.7}I_3$:2% Ce sample along with a theoretical fit (with an exponential rise and decay time plus background) to the data. In one example, the principal decay time for the sample was less than 35 ns, e.g., about 34 ns, and this component covered all of the integrated light output of the sample. Decay times of less than 30 ns (e.g., 28 ns) have also been observed. This decay component can be attributed to optical emission arising from direct capture of electron-hole pairs at the $Ce^{3+}$ sites. In one embodiment, the rise time of the scintillation pulse from $Gd_{0.3}Lu_{0.7}I_3$:2% Ce has been estimated to be approximately 0.5 ns. The initial photon intensity, a figure of merit for timing applications, has been estimated to be over 2000 photons/(ns×MeV) for $Gd_{0.3}Lu_{0.7}I_3$:2% Ce.

4. Neutron detection

Figure 5:
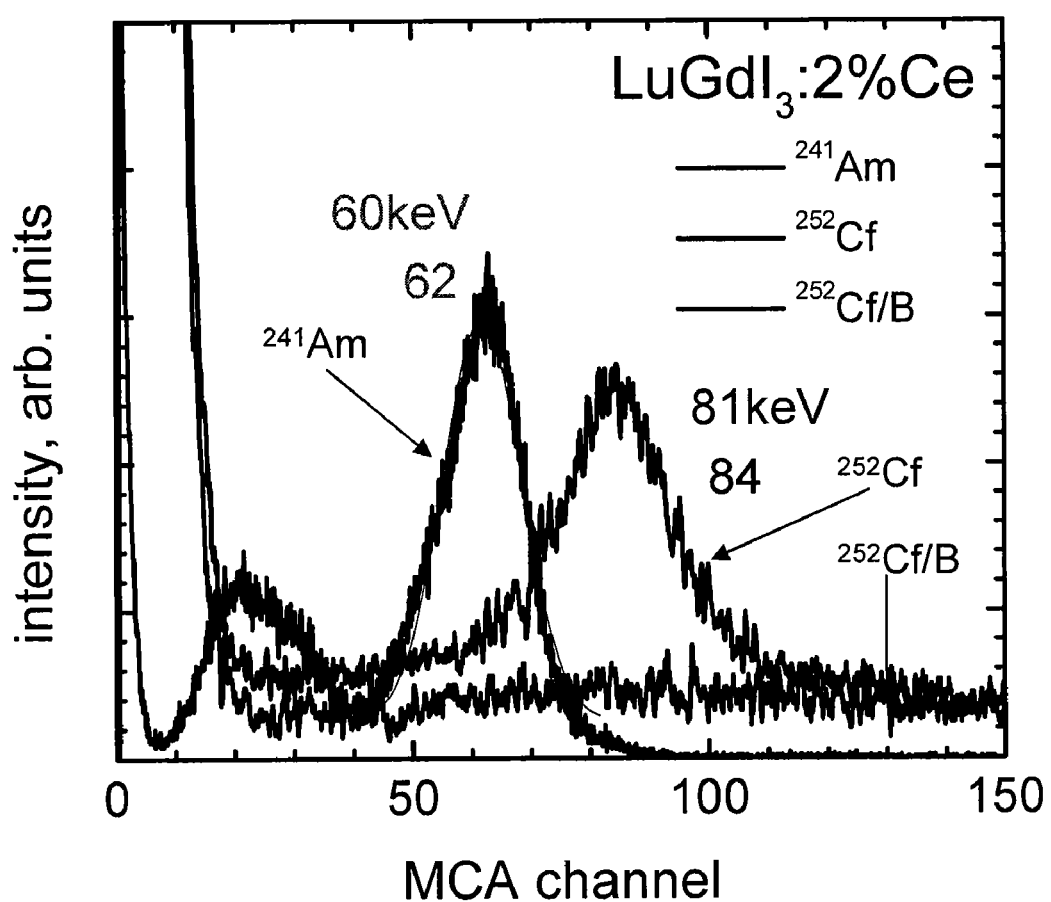
FIG. 5 depicts various spectra ($^{241}$Am, $^{252}$Cf, $^{252}$Cf/B), including neutron detection, collected in one embodiment with a $LuGdI_3$:2% Ce crystal coupled to a PMT.

The light output and energy resolution of $LuGdI_3$ crystals was further measured in response to energy sources in addition to the 662 keV γ-rays ($^{137}$Cs source), including, for example, 60 keV γ-rays ($^{241}$Am), neutron emissions ($^{252}$Cf and $^{252}$Cf/B where neutrons were blocked by a boron sheet) (see FIG. 5). Measurements were performed substantially as described above. These results further demonstrate that the scintillator compositions of the present invention are suitable for use in neutron detection, in addition to detection of gamma-ray and X-ray emissions. It is noted that channel numbers (x-axis) of the corresponding peaks are labeled (e.g., "62" and "84" in FIG. 5).

5. Time resolution

Figure 6:
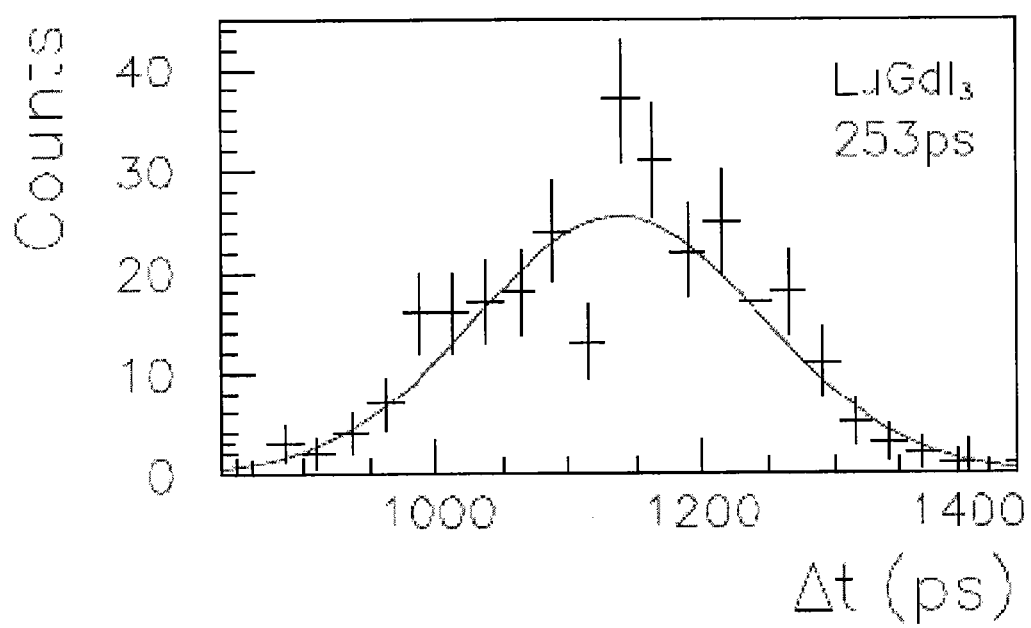
FIG. 6 depicts the time of arrival (time resolution) for a $LuGdI_3$ scintillator, according to an embodiment of the present invention.

FIG. 6 depicts the time of arrival (time resolution) for a $LuGdI_3$:2% Ce scintillator. The timing resolution measured against $LaBr_3$:5% Ce crystal for a particular $LuGdI_3$ sample in one embodiment was about 253 ps, which makes this material useful for PET and TOF PET.

6. Non-proportionality

Figure 7:
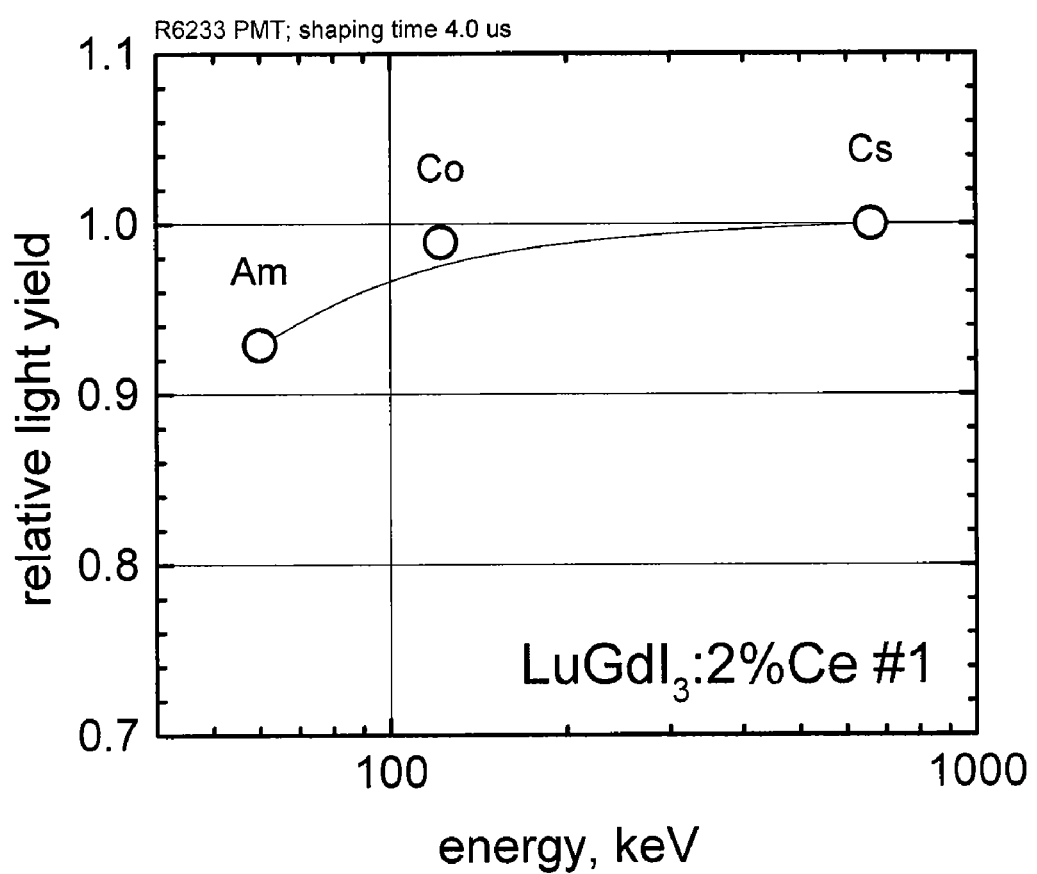
FIG. 7 depicts the non-proportionality of response for a $LuGdI_3$ scintillator, according to one embodiment of the present invention.

FIG. 7 depicts the non-proportionality of response from 60 to 662 keV for a $LuGdI_3$ scintillator, according to one embodiment of the present invention. The figure shows light output of the scintillator measured under excitation from isotopes such as $^{241}$Am (60 keV γ-rays), $^{57}$Co (122 keV γ-rays), and $^{137}$Cs (662 keV γ-rays).

Overall, these measurements indicated that the scintillator compositions as described in the present invention have high light output, fast response and show exceptional qualities in terms of light output, energy resolution, speed and proportionality of response. Those that contain a neutron absorber also permit gamma ray-neutron discrimination by pulse-shape analysis.

Example 2

Measurements were performed on prototype scintillator samples including $(Lu,Gd)I_3$ (2% Ce). The properties of samples tested are compared in Table II. The $(Lu,Gd)I_3$ sample was produced with a 1:4 ratio of Gd to Lu. Measurements were performed on single crystals of very small samples, typically 2-4 mm in each dimension. Crystals evaluated were hygroscopic, so they were packaged in sealed, windowed cylinders before testing. The packaging was not optimized for commercial production, resulting in some loss of light output. For this reason future improvements in packaging could result in better performance than what is presented here. A purpose of this example included preliminary analysis to identify crystals of interest for applications such as use in TOF-PET scanners.

For each measurement the crystal sample being tested was optically coupled to an H4998 PMT using Saint-Gobain BC-630 optical grease, and was taped in place for mechanical stability. A 13 mm diameter by 13 mm deep $LaBr_3$ (5% Ce) crystal from Saint-Gobain was similarly coupled to another H4998 PMT for use as a coincidence detector. The detectors were arranged inside a light sealed box opposite of and facing towards each other. A $^{22}$Na point source with an activity of roughly 30 µCi was then placed between them. The phototubes were operated at 2100V, and due to the high rate of activity it was necessary to keep the $LaBr_3$ crystal several centimeters away from the source. When positioned too close to the source the response of the $LaBr_3$ detector was found to be reduced, presumably due to exceeding the phototube base's ability to maintain voltage at the high resultant rate.

The setup of the readout electronics was as follows. The phototube signals were attenuated by 28 dB, and input into a LeCroy 825Z risetime compensated fast timing discriminator. The discriminator outputs were sent to a coincidence detector, with the timing arranged so that the signal from the crystal under investigation would arrive last. In the event of a coincidence, two pulses were sent from the coincidence detector to modules in a CAMAC crate. The first was sent to a gate generator, the second was used as the start for a CAEN model C414 Time to Digital converter (TDC). A copy of the discriminator output from the PMT with the reference $LaBr_3$ crystal was delayed and used as the TDC stop signal.

Copies of the input signals were delayed and sent to an integrating analog to digital converter (ADC), LRS model 2249A. The gate generator produced a gate of 150 ns during which the ADC integrated the PMT signals. Both signals were well contained within this 150 ns gate. The coincidence event data were read out from the CAMAC crate using a PC with a labview interface. The ADC pedestal was measured by triggering the coincidence detector externally with an oscillator.

In most cases the signal in one or both of the PMTs did not correspond to a photopeak event. This is mainly due to events in which the 511 keV photon Compton scattered in the sample rather than undergoing a photoelectric interaction. Because the crystals are small, it is unlikely that a photon that Compton scatters an electron will have a second interaction inside the crystal. In order to select only photopeak events, energy gates were enforced in software. This gating eliminated over 90% of the coincident events. Therefore, to make a timing measurement it was necessary to run two acquisitions; the first to find the appropriate energy gate for the crystal under consideration, and the second to take timing data with software gating applied. The energy window for the $LaBr_3$ detector was set at the start of data taking and kept constant for all crystals. The $LaBr_3$ energy spectrum was checked periodically to make sure that the photopeak had not changed position.

Table II lists the densities and scintillation properties for the scintillators tested. Density and light output data for LaBr3 and LSO were obtained from literature reports (e.g., C. W. E van Eijk, "Inorganic scintillators in medical imaging," Physics in Medicine and Biology, vol. 47, pp. R85-R106, 2002).

TABLE II

| Sample | Density (gm/cm$^3$) | Light Output (ph/MeV) | Peak Emission (nm) | Decay Time (ns) |
|---|---|---|---|---|
| LaBr$_3$ (5% Ce) | 5.3 | 61,000 | 358 | 25 |
| LSO | 7.4 | 26,000 | 420 | 40 |
| LuI$_3$:Ce | ~5.6 | 50,000 | 475 | 31 |
| Ce(Br, Cl)$_3$ | ~4.6 | 64,000 | 385 | 20 |
| (Lu, Gd)I$_3$ (2% Ce) | ~5.2-5.6 | 78,000 | 530 | 29 |
| YI$_3$ (2% Ce) | ~4 | 99,000 | 532 | 34 |

Figure 8:
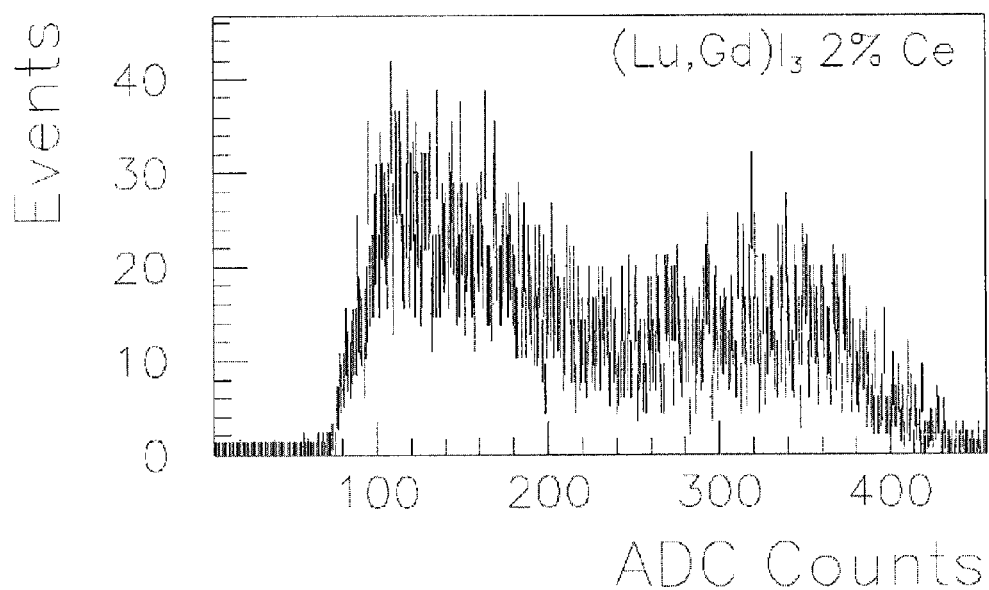
FIG. 8 shows the integrated charge for a $(Lu,Gd)I_3$ 2% Ce crystal in pedestal subtracted ADC counts.

FIG. 8 shows the integrated charge for a (Lu,Gd)I$_3$, 2% Ce in pedestal subtracted ADC counts. The peak furthest to the right in the plot indicates the response to 511 keV photons.

Pulse height response (relative to LaBr3(5% Ce) and energy resolution are shown for different crystals in Table III. The uncertainty on the relative responses is dominated by the quality of the coupling of the crystal to the PMT, and is estimated to be about 3% for all samples.

TABLE III

| Sample | Relative Light Response | FWHM |
|---|---|---|
| LaBr$_3$ (5% Ce) | 100% | 4.3% |
| LuI$_3$ (2% Ce) | 65% | 5.7% |
| Ce(Br, Cl)$_3$ | 58% | 11% |
| (Lu, Gd)I$_3$ (2% Ce) | 52% | 25% |
| YI$_3$ (2% Ce) | 50% | 8.4% |
| LuI$_3$ (5% Ce) | 41% | 17% |
| LuI$_3$ (10% Ce) | 35% | 18% |

The timing resolution is shown for different crystals in Table IV, along with the pulse height response from Table III. The timing resolution can be affected by the choice of energy window, so the windows used for the timing measurement are also shown in pedestal subtracted ADC counts. The uncertainty on the timing resolutions was about 5% for the crystals for which the photopeak was clearly separated from the Compton edge. In the cases where there was not clear separation of the photopeak due to poor energy resolution, measurements were presented as lower performance limits.

TABLE IV

| Sample | Resp | E gate | T Resolution |
|---|---|---|---|
| LaBr$_3$ (5% Ce) | 100% | 635-685 | 160 ± 10 ps |
| LuI$_3$ (2% Ce) | 65% | 405-475 | 180 ± 10 ps |
| Ce(Br, Cl)$_3$ | 58% | 345-425 | 160 ± 10 ps |
| (Lu, Gd)I$_3$ (2% Ce) | 52% | 325-415 | >255 ps |
| YI$_3$ (2% Ce) | 50% | 275-365 | >200 ps |
| LuI$_3$ (5% Ce) | 41% | 255-275 | >205 ps |
| LuI$_3$ (10% Ce) | 35% | 195-275 | >200 ps |

Figure 9:
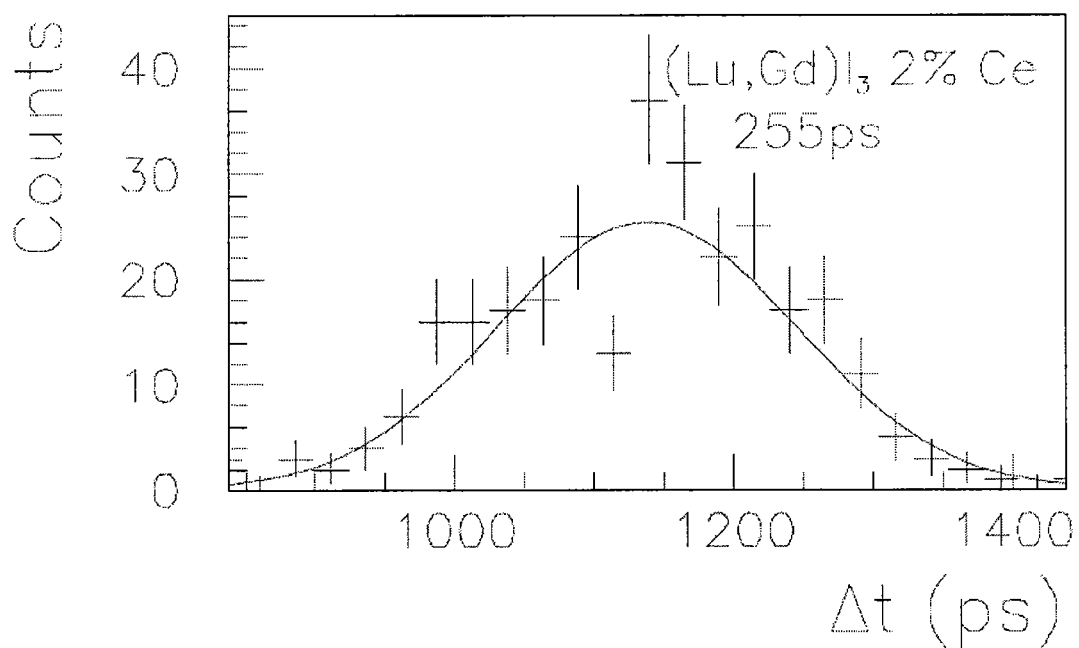
FIG. 9 shows time difference in picoseconds measured by a Time to Digital converter (TDC) for the difference in arrival times for a $(Lu,Gd)I_3$ 2% Ce crystal.

Referring to FIG. 9, the time difference measured by the TDC for the difference in arrival times for (Lu,Gd)I3 2% Ce crystal is shown in picoseconds. The central value is arbitrary, and varied due to changes in the positioning of the PMTs relative to the source. While the centroid changed in different plots, the width of each plot was kept fixed at 600 ps.

Although the invention has been described with reference to the above examples, it will be understood that modifications and variations are encompassed within the spirit and scope of the invention. Accordingly, the invention is limited only by the following claims along with their full scope of equivalents. All publications and patent documents cited in this application are incorporated by reference in their entirety for all purposes to the same extent as if each individual publication or patent document were so individually denoted.

What is claimed is:

1. A scintillator comprising a scintillation compound and a dopant, the scintillation compound comprising lutetium gadolinium halide.

2. The scintillator of claim 1, wherein the halide is iodide.

3. The scintillator of claim 1, wherein the dopant comprises Ce, Lu, La, Eu, Pr, Sm, Sr, Tl, Cl, or F.

4. The scintillator of claim 3, wherein the dopant is present in an amount from about 0.1% to about 20% by molar weight.

5. The scintillator of claim 3, wherein the dopant is present in an amount from about 1% to about 5% by molar weight.

6. The scintillator of claim 3, wherein the scintillator comprises Lu$_{0.1}$Gd$_{0.9}$I$_3$:Ce, Lu$_{0.7}$Gd$_{0.3}$I$_3$:Ce, or Lu$_{0.5}$Gd$_{0.5}$I$_3$:Ce.

7. The scintillator of claim 1, wherein the scintillator is a fast scintillator under gamma-ray excitation.

8. The scintillator of claim 7, wherein the scintillator comprises a fast decay-time constant of less than about 50 nanoseconds (ns) under gamma-ray excitation.

9. The scintillator of claim 1, wherein the scintillator comprises a light output greater than about 40,000 Photons/MeV under gamma-ray excitation.

10. The scintillator of claim 1, wherein the scintillator comprises a light output of greater than about 80,000 Photons/MeV under gamma-ray excitation.

11. The scintillator of claim 1, wherein the scintillator comprises sensitivity to both energetic photons and to neutrons.

12. A radiation detection device, comprising a scintillator comprising a lutetium gadolinium halide scintillation compound and a dopant; and a photodetection assembly optically coupled to the scintillator.

13. The device of claim 12, wherein the photodetector is optically coupled to the scintillator so as to detect scintillator luminescence upon scintillator excitation by X-rays, gamma rays, neutron emissions, or a combination thereof.

14. The device of claim 12, wherein the device is a positron emission tomography (PET) imaging device, an X-ray computed tomography (CT) imaging device, a well-logging device, or a fissionable material detection device.

15. The device of claim 12, further comprising a computer system coupled to the photodetection assembly such that the system outputs image data in response to detected radiation.

16. The device of claim 12, wherein the photodetection assembly comprises a photomultiplier tube, a photo diode, a PIN detector, or an avalanche detector.

17. An X-ray and neutron detection device, comprising:
a scintillator composition comprising a lutetium gadolinium halide scintillation compound and a dopant;
a photodetector assembly optically coupled to the scintillator composition; and
a data analysis system coupled to the photodetector assembly so that the system outputs image data in response to detected X-ray radiation or neutrons, or both.

18. The device of claim 17, further comprising a radiation source.

19. The device of claim 17, further comprising electronics configured for performing pulse-shape analysis to differentiate gamma-ray detections from neutron detections.

20. The device of claim 17, wherein the scintillator composition further comprises a reflective layer, a moisture resistant layer, or a vapor barrier.

21. A method of performing radiation detection, comprising:
providing a detection device comprising a scintillator composition comprising a scintillation compound and a dopant, the scintillation compound comprising lutetium gadolinium halide; and a photodetector assembly optically coupled to the scintillator composition; and
providing a radiation source within a field of view of the scintillator composition so as to detect emissions from the source.

22. The method of claim 21, wherein the emissions comprise gamma-ray, X-ray, or neutron emissions.

23. The method of claim 21, wherein the radiation source comprises a patient administered a detectable label.

24. The method of claim 21, wherein a patient comprising an absorber is between the radiation source and the scintillator composition.

25. A scintillator comprising a scintillation compound and a cerium dopant, the scintillation compound having a formula Lu$_x$Gd$_{(1-x)}$:Halide, wherein $0 \leq x \leq 1$.

* * * * *